United States Patent [19]
Machida

[11] 3,949,314
[45] Apr. 6, 1976

[54] PHASE DEMODULATOR

[75] Inventor: Yukihiko Machida, Mitaku, Japan

[73] Assignee: Sony Corporation, Tokyo, Japan

[22] Filed: Oct. 29, 1974

[21] Appl. No.: 519,028

[30] Foreign Application Priority Data
Nov. 6, 1973    Japan.............................. 48-124766

[52] U.S. Cl. ................ 329/107; 325/321; 328/110; 328/134; 329/124
[51] Int. Cl.² ......................................... H03K 9/04
[58] Field of Search ............ 329/104, 110, 50, 112, 329/145, 146, 124, 125, 107; 328/109, 110, 134; 325/346, 324, 320, 321

[56] References Cited
UNITED STATES PATENTS

| | | | |
|---|---|---|---|
| 3,012,200 | 12/1961 | Hurvitz | 328/134 |
| 3,101,448 | 8/1963 | Costas | 329/50 |
| 3,308,387 | 3/1967 | Hackett | 328/134 X |
| 3,500,217 | 3/1970 | Allen | 329/50 |
| 3,501,691 | 3/1970 | Ernst | 329/50 X |

Primary Examiner—John Kominski
Attorney, Agent, or Firm—Lewis H. Eslinger; Alvin Sinderbrand

[57] ABSTRACT

A reference carrier signal is combined with a phase modulated signal of the same basic frequency to generate an output signal the amplitude of which varies in accordance with the phase difference between the phase modulated signal and the reference carrier. The permissible modulation angle is increased by vectorally adding the phase modulated signal with a reference signal having a phase different from the comparison reference carrier. The vector sum signal is amplitude-limited so that the signal produced by the comparison will only be responsive to phase angle and not amplitude.

5 Claims, 15 Drawing Figures

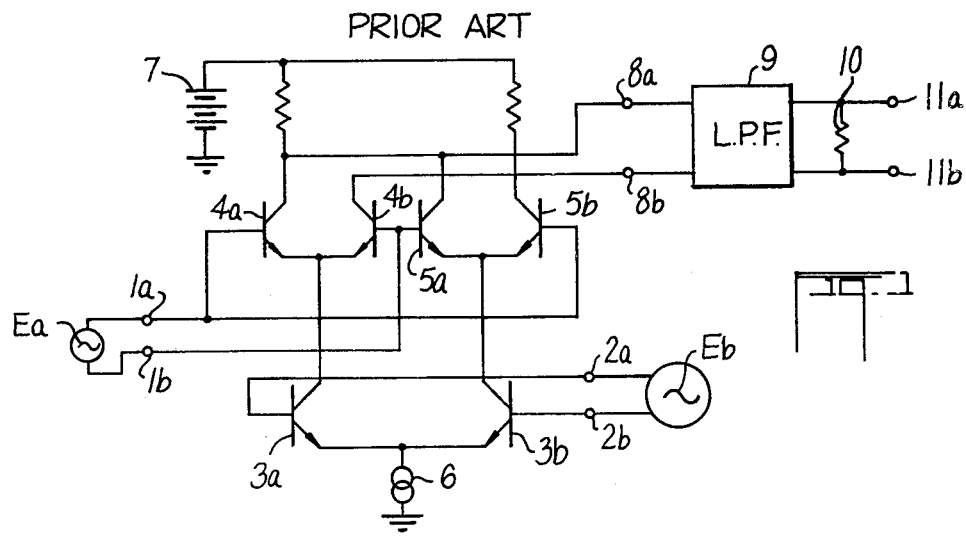
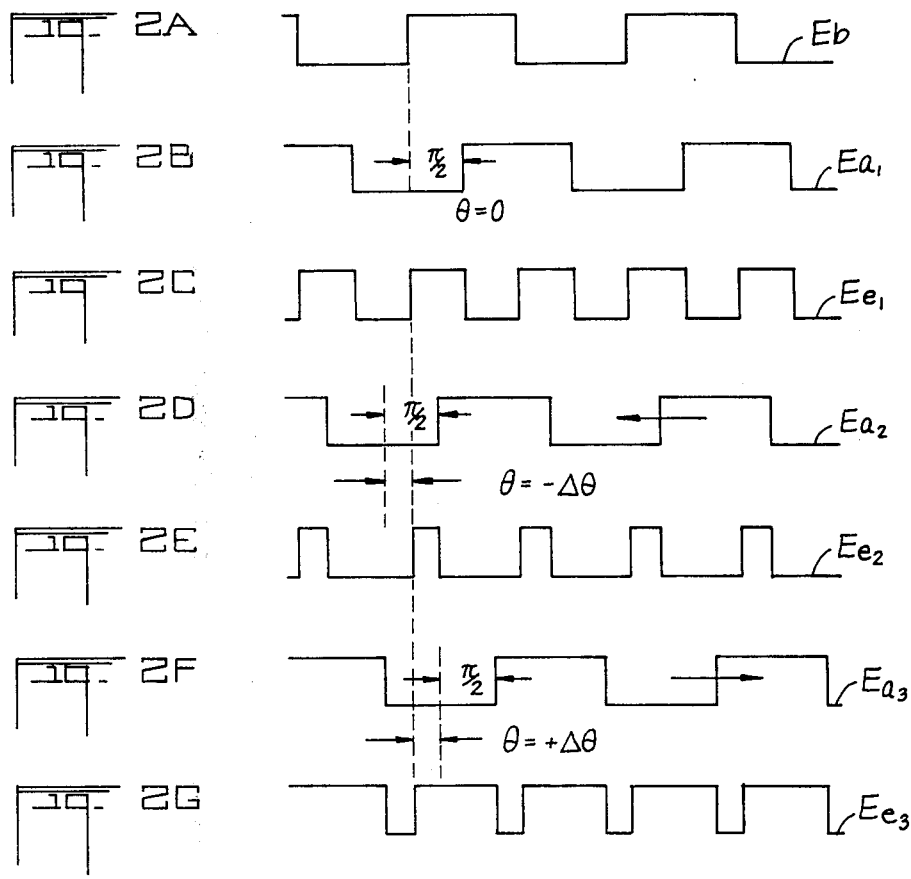

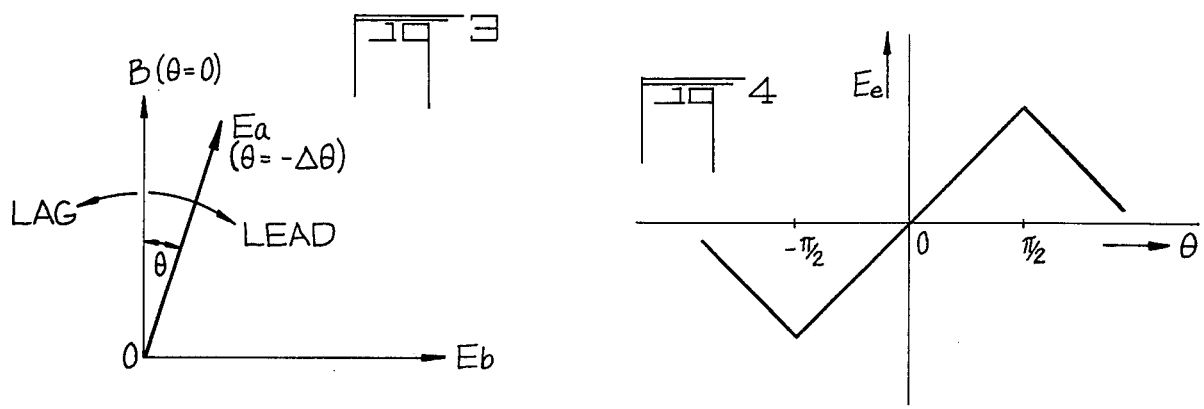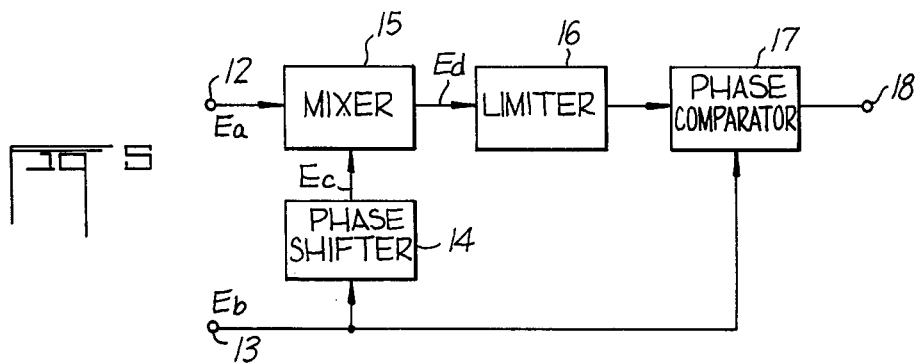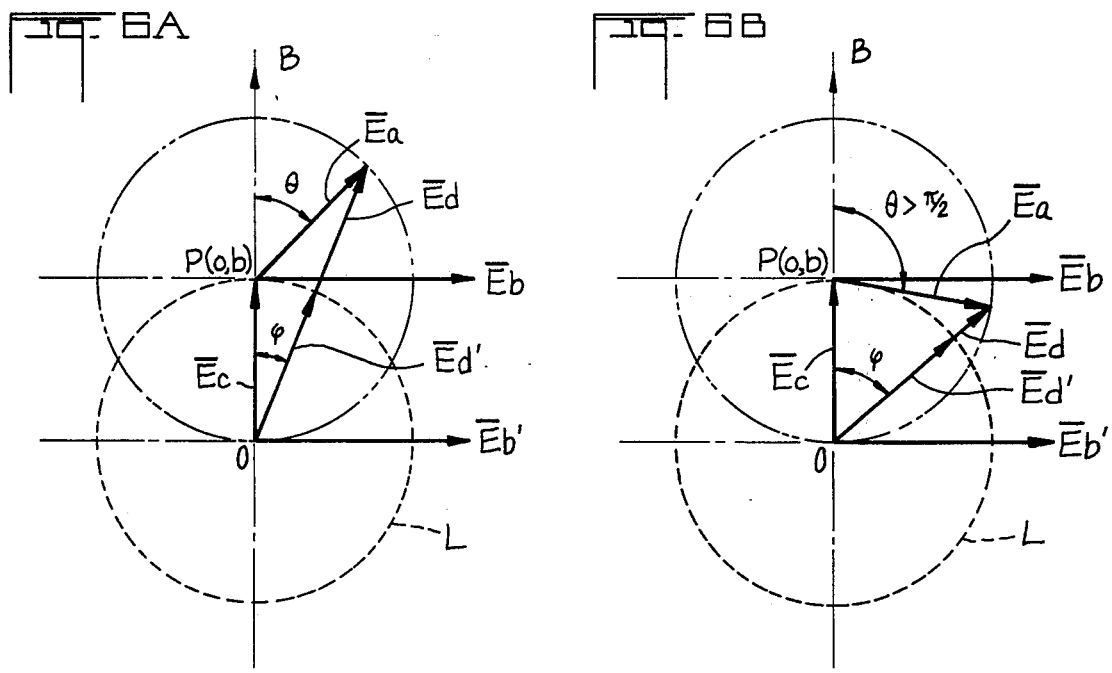

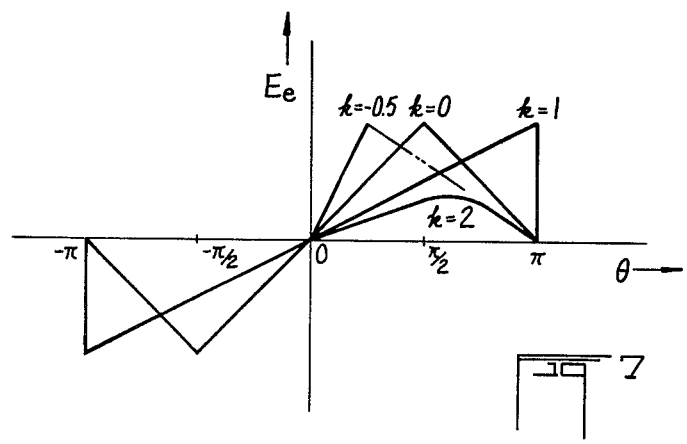
FIG. 7
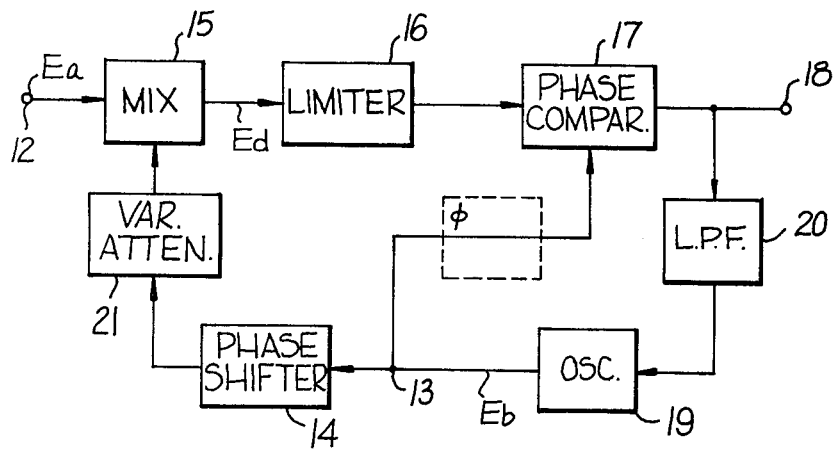
FIG. 8

PHASE DEMODULATOR

BACKGROUND OF THE INVENTION

1. Field of the Invention

This invention relates to the field of phase demodulators and particularly to phase demodulators capable of demodulating with good linearity a signal, the phase of which is varied over a wide angle.

2. The Prior Art

One type of phase demodulators used heretofore has included a balanced circuit with two sets of input terminals, one to receive the modulated signal, and the other to receive a reference carrier signal. These signals are so related that when the modulation of the phase modulated signal is zero, the phase angle of that signal will be out of phase with respect to the reference carrier by a certain angle $\theta$. When these two signals are combined, the resulting signal has certain overlap and may be represented by a pulse signal having a certain duty cycle. Phase modulation of the signal to be demodulated increases or decreases the overlap and thus, in effect, changes the duty cycle. This change in the duty cycle can be translated into a change in amplitude to complete the demodulation.

If the phase modulation is centered about a certain phase which differs by 90° from the phase of the reference carrier, the duty cycle of the overlap signal will be 50 percent for the unmodulated signal, and will increase up to 100 percent when the modulation angle is $\pi/2$ and down to 0 percent when the modulation angle is $-\pi/2$. The average value of the overlap signal thus has a peak value for a modulation angle of $\pi/2$, and a peak value of the opposite polarity for a modulation angle of $-\pi/2$. Extending the modulation angle beyond these limits, reduces the average value, which is undesirable. At modulation angles of $\pm \pi$ the average value is zero.

It is an object of the present invention to provide a phase demodulator having a wide demodulation range.

A further object of the present invention is to provide a phase demodulator that has good linearity.

A still further object of the present invention is to provide a phase demodulator capable of providing linear demodulation of signals having modulation angles that extend negatively beyond $-\pi/2$ and positively beyond $+\pi/2$.

Further objects will be apparent from the following specification together with the drawings.

SUMMARY OF THE INVENTION

According to the present invention, a phase modulated signal to be demodulated is applied to a mixer circuit to be combined with a reference signal having a certain phase relationship to a second reference signal. The combined signal is amplitude-limited and its phase is compared with the phase of the second reference signal to produce a demodulated signal that has an amplitude that varies according to the phase difference between the combined signal and the second carrier.

BRIEF DESCRIPTION OF THE DRAWINGS

FIG. 1 is a schematic circuit diagram of a balanced demodulator used in the prior art as a phase detector or demodulator.

FIGS. 2A-2G are waveform diagrams illustrating different phase relationships in the operation of the circuit in FIG. 1.

FIG. 3 is a vector diagram of signals encountered in the operation of the circuit in FIG. 1.

FIG. 4 is a graph of the demodulated signal produced by the circuit of FIG. 1.

FIG. 5 is a block diagram of a phase demodulator circuit according to the present invention.

FIGS. 6A and 6B are vector diagrams for explanation of the operation of the circuit in FIG. 5.

FIG. 7 is a graph showing the amplitude of the output signal of the circuit in FIG. 5 as a function of phase angle.

FIG. 8 is a block diagram of an embodiment of the phase demodulator illustrated in FIG. 5 as applied to a video tape recorder.

DESCRIPTION OF THE PREFERRED EMBODIMENT

The prior art balanced demodulator shown in FIG. 1 includes two input terminals $1a$ and $1b$ to which an unknown phase modulated signal $E_a$ is applied. The circuit also includes input terminals $2a$ and $2b$ to which a reference carrier signal $E_b$ is applied. The latter input terminals are connected to the bases of differentially connected transistors $3a$ and $3b$. Two other differentially connected transistors $4a$ and $4b$ are connected in the collector circuit of the transistor $3a$ and two differentially connected transistors $5a$ and $5b$ are connected in the collector circuit of the transistor $3b$. A constant current circuit 6 is connected between the common emitters of the transistors $3a$ and $3b$ and a reference voltage terminal, such as ground. The circuit is operated by a power supply 7 and two output terminals $8a$ and $8b$ are connected to the collectors of the transistors $4a$ and $5b$. The bases of the transistors $4a$ and $5b$ are connected to the input terminal $1a$ and the bases of the transistors $4b$ and $5a$ are connected to the other input terminal $1b$. The output terminals $8a$ and $8b$ are connected to a low pass filter 9 that has an output load impedance 10 and output terminals $11a$ and $11b$.

In the operation of the circuit in FIG. 1 the reference carrier signal $E_b$ is shown as a square-wave signal in FIG. 2A, and the modulated signal is illustrated with different phase relationships: In FIG. 2B as the signal $E_{a1}$, in FIG. 2D as the signal $E_{a2}$, and in FIG. 2F as the signal $E_{a3}$. When the signals $E_{a1}$ and $E_b$ are applied, respectively, to the input terminals $1a$, $1b$, and $2a$, $2b$, the output signal at the terminals $8a$ and $8b$ is a square-wave signal $E_{e1}$ shown in FIG. 2C. The relationship between the signal $E_{a1}$ and the reference carrier $E_b$ is such that there is a 90°, or $\pi/2$, phase difference. The modulation angle is indicated as $\theta$ and, in the case of $E_{a1}$ is equal to zero.

When the phase angle of the signal $E_a$ is changed by an amount $-\Delta\theta$, as shown in FIG. 2D, the resulting output signal at the terminals $8a$ and $8b$ becomes $E_{e2}$, which is illustrated as a pulse signal having less than a 50 percent duty cycle. When the phase of the signal $E_a$ is modulated in the other direction by an amount $\Delta\theta$ as illustrated by the signal $E_{a3}$ in FIG. 2F, the resulting output signal at the terminals $8a$ and $8b$ is the signal $E_{e3}$ in FIG. 2G, which has a duty cycle greater than 50 percent.

The relative phase angles between the reference carrier $E_b$ and the unknown signal $E_a$ are also shown in FIG. 3. A reference axis B, at which the phase modulation is zero, is at a right angle to the axis of the reference carrier $E_b$. This is equivalent to saying that the reference axis B corresponds to the condition in which the phase modulation angle $\theta$ is zero. In this state, the demodulated output signal $E_{e1}$ of FIG. 2C after passing through the low pass filter 9 has an amplitude of zero, as shown in FIG. 4. Variation of the phase angle $\theta$ about the axis B causes the amplitude of the signal $E_e$ to vary positively or negatively from its zero value to a positive peak at a phase modulation angle $\theta$ of $+\pi/2$ and to a negative peak at a phase modulation angle of $-\pi/2$. Within the range defined by $-\pi/2 \leq \theta \leq \pi/2$, there is a linear relationship between the angle $\theta$ and the amplitude of the output signal, but outside of this range the amplitude of the signal $E_e$ decreases when the magnitude of the angle $\theta$ increases. As a result it is difficult to demodulate a phase modulated signal that has a large modulation angle.

FIG. 5 shows a basic phase demodulator circuit according to the present invention. This circuit has a first input terminal 12 to which the unknown modulated signal $E_a$ is applied and a second input terminal 13 to which the reference carrier $E_b$ is applied. A phase shifter, or delay circuit, 14 is connected to the terminal 13 and has an output connected to a mixer circuit 15. The other input terminal of the mixer circuit is connected to the input terminal 12 and the output terminal of the mixer circuit 15 is connected through a limiter circuit 16 to a phase comparator 17 that may be the same as the phase comparator circuit in FIG. 1. The phase comparator circuit 17 is also connected to the input terminal 13 to receive the reference carrier $E_b$. The phase comparator 17 has an output terminal 18.

The operation of the circuit in FIG. 5 will be described with relation to the vector diagrams in FIGS. 6A and 6B, and the signals symbolized will be written in vector notation.

The output signal of the phase shifter 14 is identified as a signal $\overline{E}_c$ which is shown at an angle of $\pi/2$ with respect to the reference carrier $\overline{E}_b$. The signal $\overline{E}_c$ thus is in phase with the zero modulation reference axis B.

When the signal $\overline{E}_c$ is combined with the unknown signal $\overline{E}_a$ in the mixer circuit 15, the signals are vectorially added and the modulation angle $\theta$ of the unknown signal $\overline{E}_a$ is shown in FIG. 6A. The vector sum of the signals $\overline{E}_c$ and $\overline{E}_a$ is the signal $\overline{E}_d$, which has an angle $\phi$ that is less than the angle $\theta$. In vector notation $\overline{E}_c + \overline{E}_a = \overline{E}_d$. The reference carrier is duly replaced by a reference signal $\overline{E}_b'$ which is illustrated in FIG. 6A by a vector parallel to the original reference carrier $\overline{E}_b$. Assuming that the magnitude of the unknown signal $\overline{E}_a$ is constant, the vector $\overline{E}_a$ generates a circle about the point (0, b) as the angle $\theta$ varies. The radius of the circuit is $|E_a|$. The phase angle $\phi$ of the vector $\overline{E}_d$ relative to the reference axis B is expressed as follows:

$$\phi = \tan^{-1} \frac{\sin\theta}{k + \cos\theta}$$

where $$k = \frac{\overline{E}_c}{|\overline{E}_a|}.$$

When $k = 1$, or $\overline{E}_a = \overline{E}_c$, the phase angle $\phi$ is expressed as follows:

$$\phi = \tan^{-1} \frac{\sin\theta}{1 + \cos\theta} = \tan^{-1} \frac{2\sin\frac{\theta}{2}\cdot\cos\frac{\theta}{2}}{2\cos^2\frac{\theta}{2}} = \frac{\theta}{2}$$

In order to keep the output of the phase comparator 17 from being affected by the amplitude of the signal $\overline{E}_d$, this signal is passed through an amplitude limiter 16 that limits it to the value $\overline{E}_d'$ that generates a circular arc L around the origin of the graph in FIG. 6A, as the phase of $\phi$ varies through 2 radiants.

FIG. 6B is similar to FIG. 6A but shows the relationship for phase modulation angles $\theta > \pi/2$. For the condition in which the signals $\overline{E}_a$ and $\overline{E}_c$ are equal in magnitude, or $\overline{E}/\overline{E}_c = k$, and $\phi = \theta/2$. FIG. 7 shows the relationship between the phase angle $\theta$ of the signal applied to the input terminal 12 in FIG. 5 and the amplitude of the detected output signal $E_e$ at terminal 18. As mentioned previously, the detection, or demodulation, is possible within the ranges of $-\pi/2$ to $+\pi/2$, but because the signal being compared in the phase comparator 17 is the signal $\overline{E}_d'$, the phase angle is the angle $\phi$ which varies between $-\pi/2$ and $+\pi/2$ as the angle $\theta$ varies between $-\pi$ and $+\pi$ when $k = 1$. FIG. 7 also shows the relationships when $k$ is $o$ (the prior art relationship), 0.5, and 2.

FIG. 8 shows an embodiment of the present invention in a phase-locked loop operating as an FM detector and used in a magnetic video tape recorder. Those elements in FIG. 8 that correspond to elements in FIG. 5 are identified by the same reference numerals. The output signal of an oscillator 19 that has a frequency controlled by a signal from the phase comparator 17 by way of a low pass filter 20 is used as the reference signal $E_b$. A variable attenuator 21 is connected between the phase shifter 14 and the mixer 15.

In the operation of a phse-locked loop detecting circuit, a reproduced FM signal from the playback of magnetic tape in a video tape device is applied to the input terminal 12, and the oscillator 19 produces the reference signal $E_b$ at a frequency equal to that of the carrier of the FM signal. In prior art FM detectors using phase-locked loops, the phase comparator 17 would receive the FM signal directly and compare it with the output of the oscillator 19. The phase shifter 14, the variable attenuator 21, the mixer 15, and the limiter circuit 16 would not be used. Accordingly, in such prior art circuits, when a signal is transmitted over a wide band with a relatively low frequency carrier, due to the low pass filter 20 or the time constant circuit connected to the control circuit of the voltage controlled oscillator 19, a false signal is produced when the frequency is deviated beyond the proper deviation range, particularly, if the original signal has excessive high frequency components.

However, with the circuit of the invention as shown in FIG. 8, the detection range is increased to about twice the value of the prior art detection range so that even if the original signal contains many high frequency components, the possibility of producing a false signal is greatly reduced.

In the circuit shown, the phase shifter 14 is connected between the terminal 13 and the mixer 15, but it is also possible to insert the phase shifter 14 as indicated in dotted lines between the terminal 13 and the phase comparator 17. In addition, it is not necessary to limit the phase shift to $\pi/2$; it is sufficient if the reference signal $E_b$ is shifted from the phase angle of the reference carrier by a predetermined amount in order to form the phase changing signal $\bar{E}_c$.

It will be apparent that further modifications and variations may be effected by one skilled in the art without departing from the true scope of the invention.

What is claimed is:
1. A phase demodulator comprising:
   A. a first input terminal to receive a phase demodulated signal;
   B. a second input terminal to receive a first reference carrier signal;
   C. a phase shifter connected to said second input terminal to shift the phase of said reference carrier signal by a predetermined angular amount to produce a second reference carrier signal;
   D. a mixer comprising a first input circuit connected to said first input terminal to receive said phase modulated signal, and a second input circuit connected to said phase shifter to receive said second reference carrier signal to be combined with said phase modulated signal; and
   E. a phase comparator connected to said mixer and to said second input terminal to receive said first reference carrier signal to compare the phase of the output signal of said mixer with the phase of said other reference carrier signal.

2. A phase demodulator according to claim 1 comprising, in addition, a limiter connected to the output of said mixer to limit the output signal therefrom to be applied to said phase comparator.

3. A phase demodulator according to claim 1 wherein said phase shifter shifts said first reference carrier signal by an angle of $\pi/2$.

4. A phase demodulator according to claim 1 comprising, in addition, a reference frequency oscillator connected to said second input terminal, whereby the output signal of said oscillator serves as said first reference carrier signal.

5. A phase demodulator according to claim 4 in which said oscillator is a voltage controlled oscillator and said demodulator comprises, in addition, a low pass filter connecting said phase comparator to said oscillator to control the frequency of said oscillator by a filtered signal from said phase comparator.

* * * * *